United States Patent [19]
Rose et al.

[11] Patent Number: 5,764,108
[45] Date of Patent: Jun. 9, 1998

[54] APPARATUS FOR REDUCING POWER CONSUMPTION OF DEVICE CONTROLLED BY COUNTER AND NOISE DUE TO COUNTER RELOAD

[75] Inventors: Dennis Rose; Christian V. Olgaard, both of Sunnyvale; Steve Lo, Menlo Park, all of Calif.

[73] Assignee: National Semiconductor Corporation, Santa Clara, Calif.

[21] Appl. No.: 731,084

[22] Filed: Oct. 9, 1996

[51] Int. Cl.⁶ .............................. H03K 21/38; H03L 7/183
[52] U.S. Cl. .............................. 331/17; 331/25; 377/107
[58] Field of Search ...................... 331/1 A, 17, 25; 377/107

[56] References Cited

U.S. PATENT DOCUMENTS

| 5,036,216 | 7/1991 | Hohmann et al. | 331/17 |
| 5,351,015 | 9/1994 | Masumoto et al. | 331/1 R |

*Primary Examiner*—Siegfried H. Grimm
*Attorney, Agent, or Firm*—Limbach & Limbach L.L.P.

[57] ABSTRACT

An apparatus for reducing the power consumed by, and the noise generated at the output of a charge pump which is part of a phase locked loop circuit. A reduction in the power consumed by the charge pump is achieved by synchronizing the powering up of the charge pump bias circuit to the state of the counters which control the timing of the signal which triggers a charge pump cycle. In this way current is supplied to the charge pump circuit only when needed for the operation of the pump. A reduction in the noise present at the output of the charge pump caused by the reloading of the counters while the pump is activated is achieved by loading a portion of the counter bits prior to activating the pump. A circuit detects when the counter is close to a value of zero and produces a signal which loads the most significant bits of the counter. When the counter reaches a value of zero, the remaining bits are loaded. This reduces the number of counter bits which are loaded while the pump circuit is active, thus reducing the switching noise present on the pump output.

13 Claims, 4 Drawing Sheets

APPARATUS FOR REDUCING POWER CONSUMPTION OF DEVICE CONTROLLED BY COUNTER AND NOISE DUE TO COUNTER RELOAD

TECHNICAL FIELD

The present invention is directed to phase locked loop (PLL) circuits used to generate frequencies which are multiples of a reference frequency, and more specifically, to a circuit which reduces the power consumption of a charge pump which is part of the PLL circuit and the noise which occurs at the pump output as a result of a counter reload. The invention may also be applied to reduce the power consumption and output signal noise of other devices which are triggered by a counter signal.

BACKGROUND OF THE INVENTION

A phase locked loop (PLL) circuit is used to generate signals having frequencies which are multiples of a reference frequency. A typical PLL circuit uses a feedback loop to maintain a specific phase relationship between an output signal and a reference signal. FIG. 1 is a block diagram of a prior art phase locked loop circuit 10. In the PLL circuit of FIG. 1, voltage controlled oscillator (VCO) 12 generates a signal having a frequency determined by the voltage applied to its input. For example, as the voltage at the input to VCO 12 increases, the frequency of the output signal increases.

The frequency of the signal generated by VCO 12 is input to prescaler 13 which acts to prescale, i.e., divide, the frequency of the VCO signal by a fixed or limited number of, predetermined integers. The output of prescaler 13 is divided down by loadable N-counter 14. A reference signal 20 is divided down by loadable R-counter 16. The output of N-counter 14 is compared to the output of R-counter 16 by phase comparator 18. Phase comparator 18 produces an output signal which is proportional to the phase difference between its two inputs (the outputs of N-counter 14 and R-counter 16).

Counters 14 and 16 are set to an initial value and then count down to zero. When a counter reaches a value of zero, a pulse is generated by the counter and input to phase comparator 18. In addition, the counter is reloaded with the initial value and the cycle repeats. Phase comparator 18 determines which of the signals output by the counters arrived at its inputs first and produces an appropriate output signal which activates a cycle of charge pump 22. Based on the output of phase comparator 18, charge pump 22 either increases ("pumps up") or decreases ("pumps down") the voltage generated at its output. The output of charge pump 22 is passed through loop filter 24 which low pass filters the signal, and then is input to VCO 12.

The voltage output by charge pump 22 acts to control the frequency of the signal output by VCO 12. The feedback loop between the outputs of charge pump 22 and VCO 12 serves to adjust the VCO frequency to cause the timing of the output signals of counters 14 and 16 to approach each other (i.e., to reduce the phase difference between the counter outputs). This causes the phase of the signal output by N-counter 14 to approach that of R-counter 16. The initial values loaded into N-counter 14 and R-counter 16, along with the divisor of prescaler 13, determine the frequency of the signal generated by VCO 12 (by determining the multiple of the reference signal which is generated). After the VCO 12 output settles to a stable value, it may be sampled at output node 11.

While the PLL circuit of FIG. 1 is suited to generating an output signal of a desired frequency, in normal operation, the circuit has certain disadvantages. These relate to the power consumption of the circuit and the noise on the charge pump output signal which is generated during the reloading of the counters.

Charge pump 22 typically contains or is connected to a bias current circuit which is used to pre-charge the stages of the pump circuit in preparation for a pump cycle. However, the bias circuit signal (and hence the current input to the pump) only needs to be applied prior to and during an actual charge pump cycle. This is because the pump output is tri-stated at all other times. As typical operation of the charge pump involves having the bias current on at all times, this represents an unnecessary use of power.

In addition, when the initial values for counters 14 and 16 are reloaded after each counter counts down to zero, several bits of the counters may be changed. This can produce "switching" noise spikes on the output of phase comparator 18. The noise spikes can produce noise on the output signal generated by charge pump 22. As the frequency of the signal produced by VCO 12 is very sensitive to the input voltage, noise present in the charge pump signal input to VCO 12 can result in undesired frequency components such as phase noise and spurious tones being generated by VCO 12.

In addition to the example of a PLL circuit which has been discussed, there are many other circuits in which the circuit operation is triggered by a signal generated by a counter. If the circuit is sensitive to noise produced during the counter reload, then this can disrupt the proper operation of the circuit.

What is desired is an apparatus for reducing the power consumed by a charge pump which is controlled by a counter as part of a phase locked loop circuit. It is also desirable to have an apparatus which reduces the noise generated at the output of the charge pump due to the reloading of the counters used to trigger the charge pump cycles.

SUMMARY OF THE INVENTION

The present invention is directed to apparatus or circuits for reducing the power consumed by, and the noise generated at the output of a charge pump which is part of a phase locked loop circuit. A reduction in the power consumed by the charge pump is achieved by synchronizing the powering up of the charge pump bias circuit to the state of the counters which control the timing of the signal which triggers a charge pump cycle. In this way current is supplied to the charge pump circuit only when needed for the operation of the pump.

A reduction in the noise present at the output of the charge pump caused by the reloading of the counters while the pump is activated is achieved by loading a portion of the counter bits prior to activating the pump. A counter reload circuit detects when the counter is close to a value of zero and produces a signal which reloads the most significant bits of the counter. When the counter reaches a value of zero, the charge pump is activated and the remaining bits are loaded. This reduces the number of counter bits which are loaded while the pump circuit is active, thus reducing the switching noise present at the pump output.

Further objects and advantages of the present invention will become apparent from the following detailed description and accompanying drawings.

DETAILED DESCRIPTION OF THE INVENTION

Figure 2:
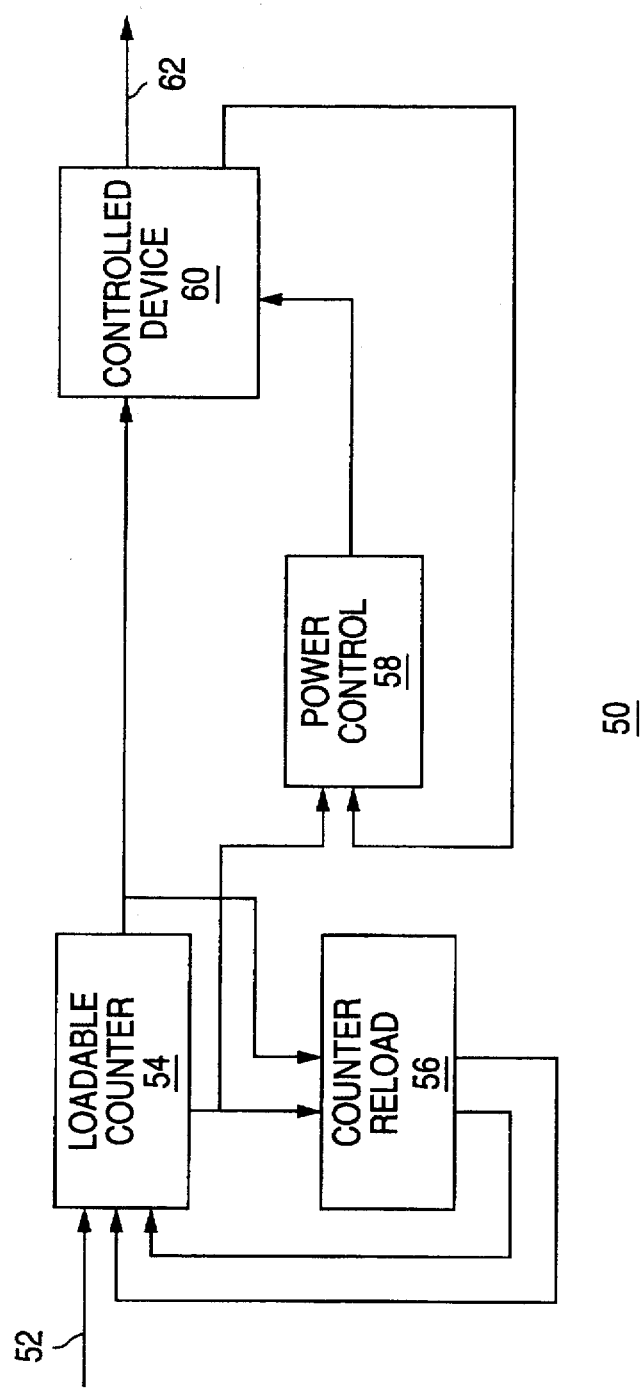
FIG. 2 is a block diagram of a circuit for controlling a device which includes the circuits of the present invention for reducing the power consumption of the device and the switching noise at the device output.

FIG. 2 is a block diagram of a circuit 50 for controlling a device 60 which includes the circuits of the present invention for reducing the power consumption of the device and the switching noise at the device output. Device 60 is of a type which repeatedly performs an operation or function under the control of a signal produced by loadable counter 54. The control signal is produced by the counter after the counter counts down to zero from an initial value (in the case of a decrementing counter) or up to a final value from zero (in the case of an incrementing counter). Note that counter 54 may be implemented to include a counter and the logic for detecting when the counter contents reaches a specified value. A different implementation may separate the counter and detect logic.

An input signal 52 is provided to loadable counter 54. Signal 52 may take the form of a signal having a frequency which is divided down by the operation of counter 54 or may be a control signal used to initiate the operation of counter 54.

A first output signal of counter 54 is provided as an input to counter reload module 56 and power control module 58. A second output of counter 54 is provided as a control signal to controlled device 60 and counter reload module 56. Note that although the input signals to reload module 56 and power control module 58 have been described as being the same signal, different signals may be output by counter 54 for these purposes. A first output of counter reload module 56 is provided as a control signal to counter 54 which causes the (partial) reloading of counter 54. A second output of counter reload module 56 is provided as a control signal to counter 54 which reloads the remainder of counter 54. Power control module 58 controls the availability of the power required to operate controlled device 60, which typically takes the form of a bias current used to power up the device prior to the triggering of a new cycle of the device by the second output signal from counter module 54. An output of device 60 is provided at output node 62.

The contents of counter 54 can be divided into two sections, one containing the most significant bits of the data value which is counted down (in the case of a decrementing counter) and a second section containing the least significant bits of the data value. When the contents of the portion of counter 54 containing the most significant bits reaches zero, the first output signal is produced. Similarly, when the contents of the portion of counter 54 containing the least significant bits reaches zero, the second output signal is produced. When the first output signal is produced by counter 54, it causes two events to occur. Firstly, it acts as a control signal, causing power control module 58 to provide a bias current to device 60. Secondly, it acts as a control signal for counter reload module 56, which responds by reloading a portion of the initial counter value (typically the most significant bits) into counter 54. Although the first output signal has been described as being responsible for two functions, it is noted that instead of the same signal, different signals could be used to initiate the two functions. When the second (or third in the case where different signals are used for the bias current control signal and counter reload) output signal is produced by counter 54, it acts to trigger a new cycle of device 60. This signal can also be used to reset the logic contained in counter reload module 56. The least significant bits of counter 54 are reloaded in response to the output signal of counter 54 which triggers the operation of device 60. They may also be reloaded in response to a second output signal produced by counter reload module 56.

By reloading a portion of the initial data value into counter 54 prior to the triggering of a new cycle of device 60, the noise present at output node 62 of device 60 due to reloading of counter 54 is reduced. Furthermore, by using the first output signal from counter 54 to initiate the provision of power to device 60 prior to the triggering of a new cycle, the current provided can settle down to a stable value prior to the start of a new cycle. Furthermore, a control signal output by device 60 at the end of a cycle of its operation causes power control circuit 58 to discontinue providing power to device 60. By controlling the power supplied to device 60 so that it is provided just prior to the start of a new cycle and is discontinued just after the completion of the cycle, the amount of power used to operate device 60 can be reduced.

In a more general form of the present invention, the control signals which have been described may be provided by other parts of the circuitry. In particular, counter reload module 56 may be used to generate control signals for operation of power control module 58 or device 60 in response to the output signals provided by counter 54.

Figure 1:
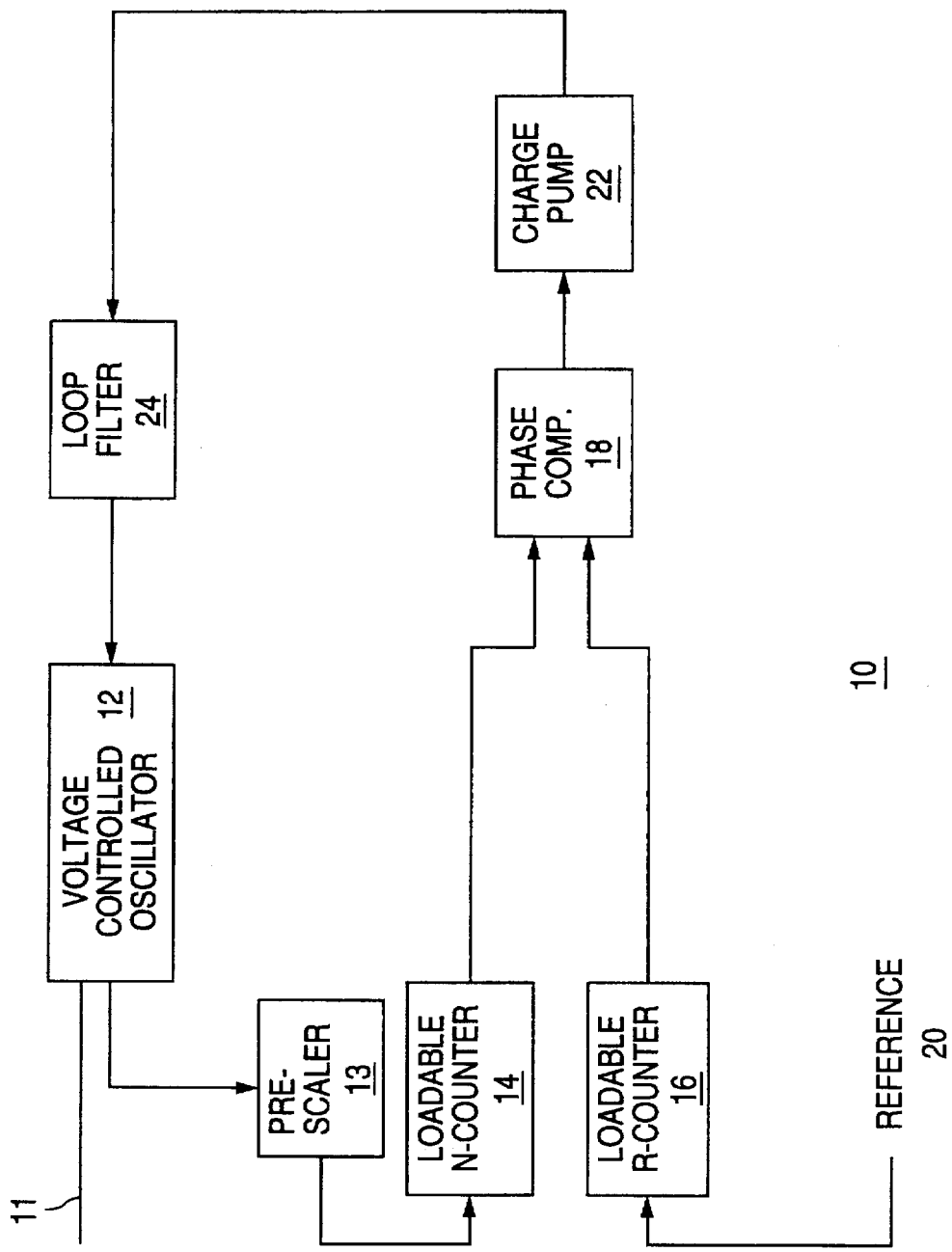
FIG. 1 is a block diagram of a prior art phase locked loop circuit.
Figure 3:
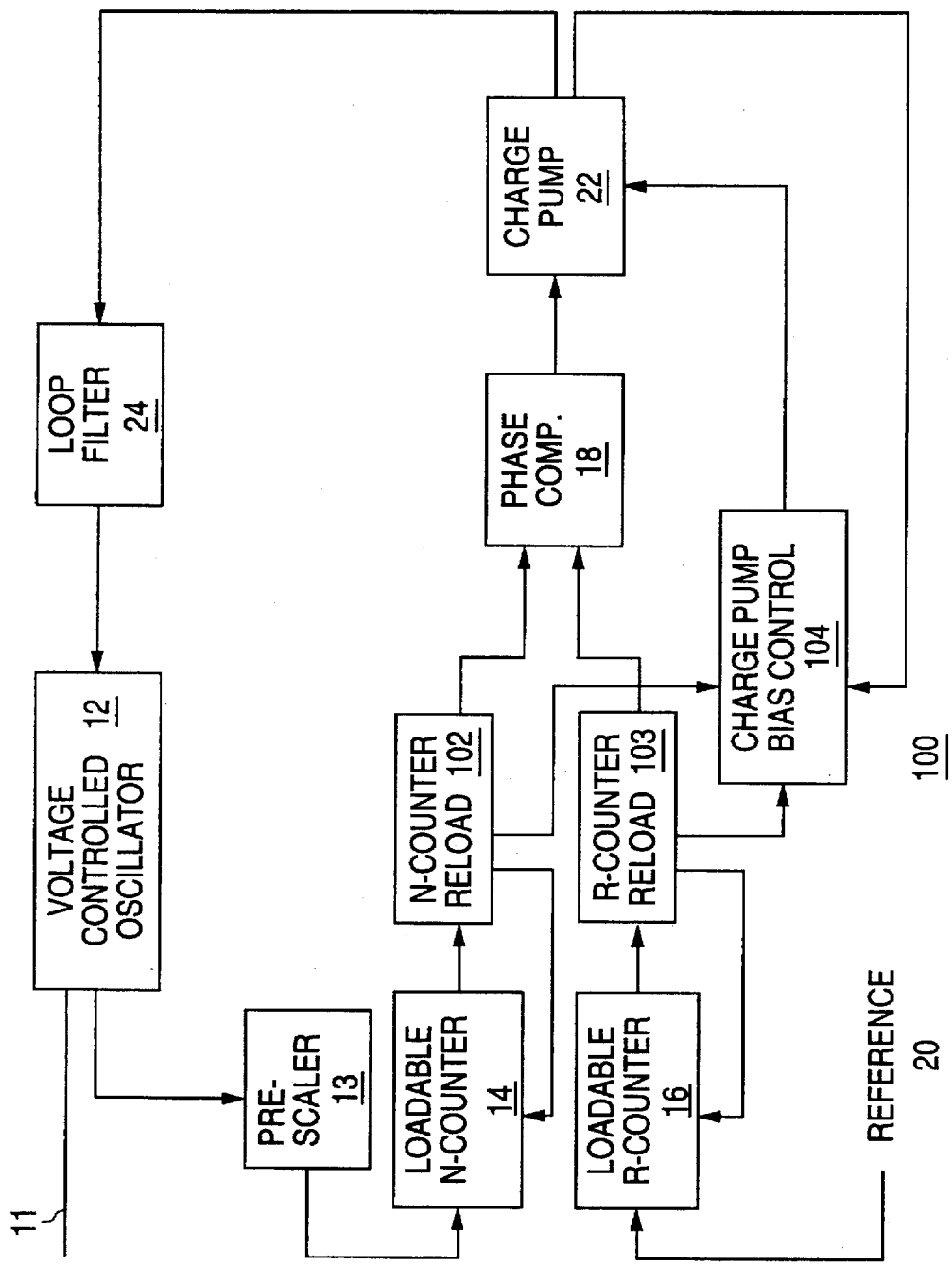
FIG. 3 is a block diagram of a phase locked loop circuit which includes the circuits of the present invention for reducing the power consumption of a charge pump and the switching noise at the pump output.

FIG. 3 is a block diagram of a phase locked loop circuit 100 which includes the circuits of the present invention for reducing the power consumption of a charge pump and the switching noise at the pump output. As with the circuit shown in the block diagram of FIG. 1, voltage controlled oscillator (VCO) 12 is used to generate a signal having a frequency determined by the voltage applied to its input. The frequency of the signal generated by VCO 12 is prescaled by prescaler 13, the output of which is divided down by loadable N-counter 14. The output of N-counter 14 is provided to N-counter reload 102 and charge pump bias control 104 circuits. Reference signal 20 is input to loadable R-counter 16. The output of R-counter 16 is provided to R-counter reload 103 and charge pump bias control 104 circuits. An output of counter reload circuits 102 and 103 are provided to phase comparator 18. A second output of counter reload circuits 102 and 103 is provided as a load control signal to counters 14 and 16, respectively. The output of charge pump bias control circuit 104 is provided as a control signal which serves to activate the bias current circuit(s) of charge pump 22.

As before, phase comparator 18 determines which of its input signals arrived first and produces an output signal which controls the operation of charge pump 22. Based on the output of phase comparator 18, charge pump 22 either increases or decreases the voltage generated at its output which is passed through loop filter 24 and input to VCO 12. Charge pump 22 also produces an output signal indicating the completion of a charge pump cycle which is provided as an input to bias control circuit 104.

Figure 4:
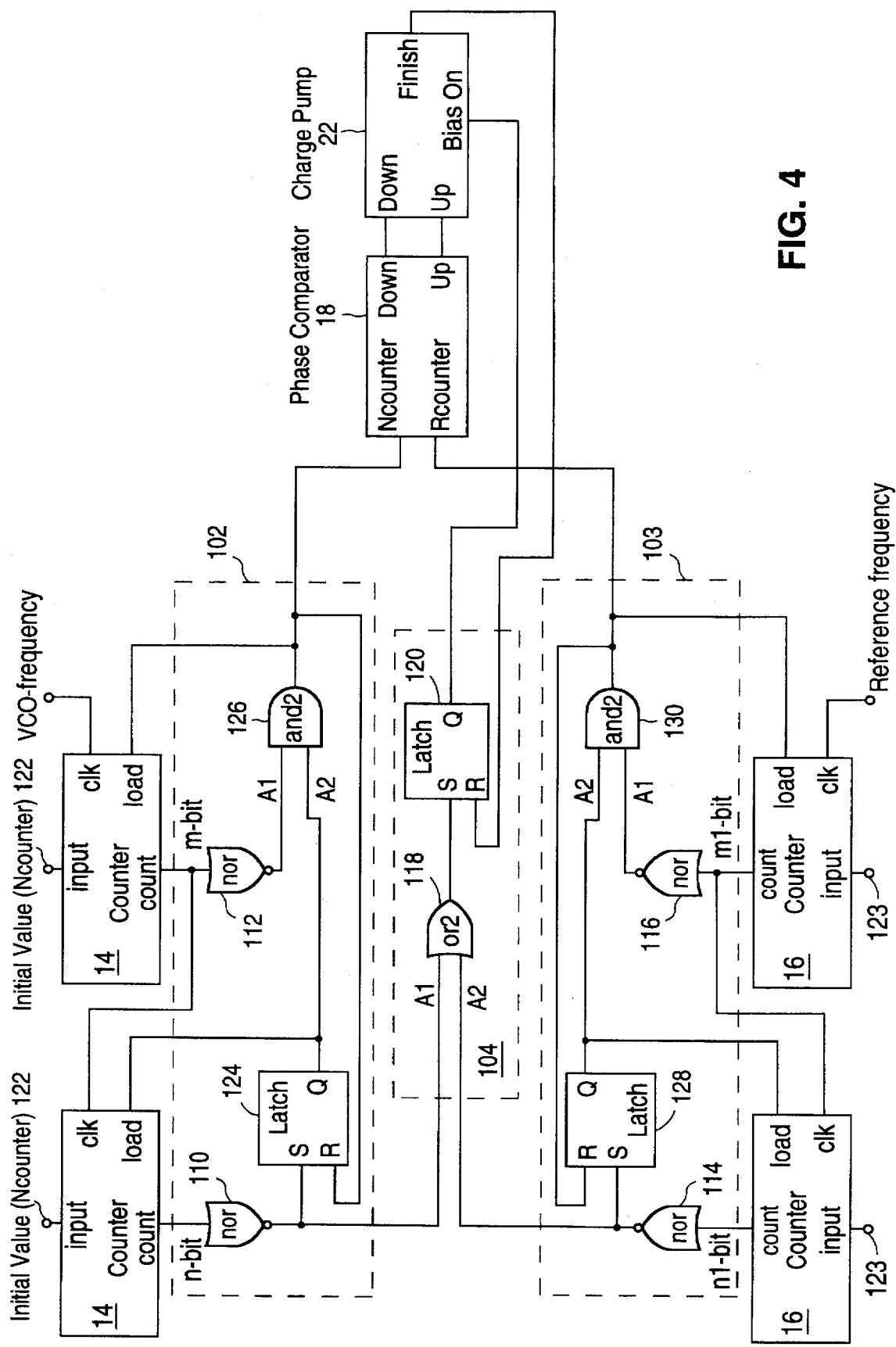
FIG. 4 is a schematic diagram of portions of the phase locked loop circuit of FIG. 3.

FIG. 4 is a schematic diagram of portions of the phase locked loop circuit of FIG. 3. The circuit elements which are part of counter reload circuits 102 and 103 and charge pump bias control circuit 104 are indicated by dashed lines. As indicated, the contents of counter 14 can be divided into n most significant bits and m least significant bits. Similarly, the contents of counter 16 can be divided into n1 most significant bits and m1 least significant bits.

When the contents of the portion of counter 14 containing the most significant bits reaches zero, NOR gate 110 produces an output signal. Similarly, when the contents of the portion of counter 14 containing the least significant bits reaches zero, NOR gate 112 produces an output signal. Similarly, NOR gate 114 produces an output signal when the portion of counter 16 containing the most significant bits reaches zero, and NOR gate 116 produces an output signal when the portion of counter 16 containing the least significant bits reaches zero. Thus, when the most significant bits of counter 14 have a value of zero, the output of NOR gate 110 goes high. When the most significant bits of counter 16 have a value of zero, the output of NOR gate 114 goes high.

The outputs of NOR gates 110 and 114 are input to two-input OR gate 118. When either of the inputs to OR gate 118 is high, the output will be high. This will set latch 120, providing a high output which acts to turn on the bias circuit of charge pump 22. Because the bias current circuit is activated prior to the triggering of a charge pump cycle (which occurs when both the most and least significant bits of the counter have a value of zero), the bias current level can settle to a well defined state prior to the initiation of the pump cycle. At the completion of a pump cycle, a charge pump finish signal is produced by pump 22. This finish signal is used to reset latch 120, thereby causing the output of the latch to go low and de-activate the bias on circuit of pump 22.

The combination of OR gate 118 and latch 120 thus are part of charge pump bias control circuit 104 and serve to control the supply of the bias current to charge pump 22. By activating the bias current just prior to the start of a new charge pump cycle and turning off the bias current at the completion of a pump cycle, the power consumed by the pump is reduced below the level it would have if the bias current were left on during operation of the phase locked loop circuit.

An issue relating to the reset of latch 120 and the deactivation of the bias current circuit in charge pump 22 is that NOR gates 110 and 114 need to be reloaded with non-zero values prior to the end of the charge pump cycle in order to cause the outputs of those gates to go low. This allows the finish signal from pump 22 to reset latch 120. This problem is addressed by the operation of counter reload circuits 102 and 103 which will now be described.

Counter reload circuits 102 and 103 serve two primary purposes: (1) to reduce the noise generated at the output of charge pump 22 as a result of resetting the counter values; and (2) to reset the counter values at the proper time to permit latch 120 to be reset by the finish signal from pump 22. Both of these purposes are achieved by reloading the most significant bit counters of counters 14 and 16 at the appropriate time, i.e., before activating a new charge pump cycle.

Counter reload circuits 102 and 103 act to load a portion of the initial value bits into the respective counters prior to activating a new charge pump cycle. Circuits 102 and 103 do this by detecting when the counter values are close to zero. A signal is then produced which causes a latch to load the most significant bits of the counters. When the counters reach a value of zero, the remaining bits are loaded and the latched signal is cleared.

As discussed previously, N-counter 14 and R-counter 16 can be divided into two sections or counters, a first section containing the n (or n1) most significant bits of the counter and a second section containing the m (or m1) least significant bits. An initial value 122 serves as an input to counter 14 and represents the number to be loaded into the counter when it reaches zero. Similarly, initial value 123 serves as an input to counter 16 and represents the number to be loaded into the counter when it reaches zero. Initial value 122 is n+m bits wide, while initial value 123 is n1+m1 bits wide.

When the most significant section of counter 14 reaches a value of zero, the output of NOR gate 110 goes high. This sets latch 124, causing the most significant section of counter 14 to be loaded with the n most significant bits of initial value 122. When the least significant bit section of counter 14 reaches a value of zero, the output of NOR gate 112 goes high. With the outputs of both latch 124 and NOR gate 112 high, the output of AND gate 126 is high. This causes the m least significant bits of initial value 122 to be loaded into counter 14. This situation also causes latch 124 to be reset.

The output of AND gate 126 also serves as the N-counter input to phase comparator 18. Thus, the signal which is input to the phase comparator and ultimately serves as a control signal to activate a new charge pump cycle is generated after counter 14 is reloaded with the most significant bits of the initial value. Only the m least significant bits are loaded into counter 14 during the active part of the charge pump cycle. This reduces the noise at the charge pump output caused by the counter reset.

With regards to counter 16, when the most significant section of counter 16 reaches a value of zero, the output of NOR gate 114 goes high. This sets latch 128, causing the most significant section of counter 16 to be loaded with the n1 most significant bits of initial value 123. When the least significant section of counter 16 reaches a value of zero, the output of NOR gate 116 goes high. With the outputs of both latch 128 and NOR gate 116 high, the output of AND gate 130 is high. This causes the m1 least significant bits of initial value 123 to be loaded into counter 16. This situation also causes latch 128 to be reset.

The output of AND gate 130 also serves as the R-counter input to phase comparator 18. Thus, the signal which is input to the phase comparator and ultimately serves as a control signal to activate a new charge pump cycle is generated after counter 16 is reloaded with the most significant bits of the initial value. Only the m1 least significant bits are loaded into counter 16 during the active part of the charge pump cycle. This reduces the noise at the charge pump output caused by the counter reset.

In addition, the reloading of counters 14 and 16 with the most significant bits of the respective initial values prior to activation of a new charge pump cycle causes the output of NOR gates 110 and 114 to go low (if a non-zero value is loaded), thereby allowing latch 120 to be reset by the finish signal generated by pump 22 after completion of the pump cycle.

Although the charge pump bias current control and counter reload circuits of the present invention have been described in detail with reference to a phase locked loop, as indicated by FIG. 2, these circuits may be used to reduce the power consumption and output noise of other devices whose operation is triggered by a counter. By timing the counter reloading so that a portion of the counter contents is reloaded prior to activation of a new cycle of the device, switching noise at the output of the device due to the reload is reduced.

In addition, by using a signal resulting from a partial counter countdown to control the power supplied to the device, the power consumption is reduced compared to a situation in which the power is supplied at all times.

Similarly, although the present invention has been described with reference to decrementing counters, one skilled in the art will readily understand how to implement the circuits for use with incrementing counters. Furthermore, the bias current activation and counter reload can be set up to occur at a desired counter value by adjusting the number of bits in the counter. For example, if a counter contains 8 bits of data, then the most significant bits of the initial value will be reloaded when the counter value reaches 16, as that value represents the maximum value of the least significant bits. In addition, the bias current activation and counter reload can be set to occur at different counter values. A minimum count of zero was used in the description of the invention for convenience, values other than zero could be used as well.

Finally, although the present invention has been described in the context of a phase locked loop in which a reference signal is divided by an R-counter, note that such a counter is not necessary and that the reference may be input without being scaled.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. A phase locked loop, comprising:
   a voltage controlled oscillator which generates an output signal having a frequency dependent upon an input voltage;
   a first counter which divides the output signal of the voltage controlled oscillator, the first counter having first and second data sections and producing a first output signal when the first data section has a value of zero and a second output signal when the second data section has a value of zero, wherein the first data section has a value of zero before the second data section has a value of zero;
   a first counter reload circuit which generates an output signal which acts to reload the first data section of the first counter in response to the first output signal of the first counter, and generates a second output signal upon receipt of the second output signal of the first counter;
   a charge pump control circuit which outputs a charge pump control signal which initiates a cycle of a charge pump in response to the second output signal of the first counter reload circuit; and
   a charge pump having an input which is the charge pump control signal output by the charge pump control circuit, the charge pump control signal acting to initiate a cycle of the charge pump and produce a charge pump output signal which provides the input voltage for the voltage controlled oscillator.

2. The phase locked loop of claim 1, wherein the charge pump includes a bias current circuit which provides a biasing current for operation of the charge pump in response to a bias current control signal, and the phase locked loop further comprises:
   a charge pump bias current control circuit having the first output signal of the first counter reload circuit as an input and the bias current control signal as an output.

3. The phase locked loop of claim 2, wherein the charge pump generates a second bias current control signal at the conclusion of the charge pump cycle, and further, wherein the second bias current control signal acts to turn off the bias current.

4. The phase locked loop of claim 1, further comprising:
   a second counter which divides a reference signal, the second counter having first and second data sections and producing a first output signal when the first data section has a value of zero and a second output signal when the second data section has a value of zero, wherein the first data section has a value of zero before the second data section has a value of zero; and
   a second counter reload circuit which generates an output signal which acts to reload the first data section of the second counter in response to the first output signal of the second counter, and generates a second output signal upon receipt of the second output signal of the second counter, wherein the charge pump control circuit is a phase comparator which outputs the charge pump control signal in response to the second output signals of the first and second counter reload circuits.

5. A phase locked loop, comprising:
   a voltage controlled oscillator which generates an output signal having a frequency dependent upon an input voltage;
   a first counter which divides the output signal of the voltage controlled oscillator, the first counter having first and second data sections and producing a first output signal when the first data section has a value of zero and a second output signal when the second data section has a value of zero, wherein the first data section has a value of zero before the second data section has a value of zero;
   a phase comparator which outputs a charge pump control signal which initiates a cycle of a charge pump in response to the second output signal of the first counter;
   a charge pump having an input which is the charge pump control signal output by the phase comparator, the charge pump control signal acting to initiate a cycle of the charge pump and produce a charge pump output signal which provides the input voltage for the voltage controlled oscillator, wherein the charge pump includes a bias current circuit which provides a biasing current for operation of the charge pump in response to a bias current control signal; and
   a charge pump bias current control circuit which produces the bias current control signal in response to the first output signal of the first counter.

6. The phase locked loop of claim 5, further comprising:
   a first counter reload circuit which generates an output signal which acts to reload the first data section of the first counter in response to the first output signal of the first counter.

7. The phase locked loop of claim 5, wherein the charge pump generates a second bias current control signal at the conclusion of the charge pump cycle, and further, wherein the second bias current control signal acts to turn off the bias current.

8. The phase locked loop of claim 5, further comprising:
   a second counter which divides a reference signal, the second counter having first and second data sections and producing a first output signal when the first data section has a value of zero and a second output signal when the second data section has a value of zero, wherein the first data section has a value of zero before the second data section has a value of zero; and a second counter reload circuit which generates an output signal which acts to reload the first data section of the second counter in response to the first output signal of the second counter.

9. The phase locked loop of claim 5, wherein the phase comparator outputs the charge pump control signal in response to the second output signals of the first and second counters.

10. A counter-controlled apparatus comprising:

a counter circuit including a counter having first and second data sections and producing a first output signal when the first data section has a value of zero and a second output signal when the second data section has a value of zero, wherein the first data section has a value of zero before the second data section has a value of zero;

a counter reload circuit which generates an output signal which acts to reload the first data section of the counter in response to the first output signal of the counter circuit; and a controlled circuit which initiates a cycle in response to the second output signal of the counter circuit.

11. The counter-controlled apparatus of claim 10, wherein the controlled circuit includes a bias current circuit which provides a biasing current for operation of the controlled circuit in response to a bias current control signal, and the apparatus further comprises:

a bias current control signal circuit which produces the bias current control signal in response to the first output signal of the counter circuit.

12. The counter-controlled apparatus of claim 11, wherein the controlled circuit generates a second bias current control signal at the conclusion of the cycle, and further, wherein the second bias current control signal acts to turn off the bias current.

13. A method of reducing the noise generated at the output of a device controlled by a signal generated by a counter due to reloading of the counter, comprising:

loading a counter with a data set having a first data part and a second data part;

generating a first counter output signal in response to the counter decrementing to a value of zero in the first data part;

reloading the first data part of the counter in response to the first counter output signal;

generating a second counter output signal in response to the counter decrementing to a value of zero in the second data part; and operating the device in response to the second counter output signal.

* * * * *